United States Patent
Ryu et al.

(10) Patent No.: US 7,531,849 B2
(45) Date of Patent: May 12, 2009

(54) HIGH PERFORMANCE FET DEVICES

(75) Inventors: Yungryel Ryu, Columbia, MO (US);
Tae-seok Lee, Naperville, IL (US);
Henry W. White, Columbia, MO (US)

(73) Assignee: Moxtronics, Inc., Columbia, MO (US)

( * ) Notice: Subject to any disclaimer, the term of this patent is extended or adjusted under 35 U.S.C. 154(b) by 236 days.

(21) Appl. No.: 11/339,299

(22) Filed: Jan. 25, 2006

(65) Prior Publication Data

US 2006/0226443 A1    Oct. 12, 2006

Related U.S. Application Data

(60) Provisional application No. 60/647,177, filed on Jan. 25, 2005.

(51) Int. Cl.
*H01L 33/00* (2006.01)

(52) U.S. Cl. .................. 257/103; 257/134; 257/192; 257/272; 257/288; 257/E27.069; 257/E27.081; 257/E29.039; 257/E29.116; 257/E31.073

(58) Field of Classification Search ............... None
See application file for complete search history.

(56) References Cited

U.S. PATENT DOCUMENTS

| | | | |
|---|---|---|---|
| 4,935,377 A | 6/1990 | Strifler et al. | |
| 5,081,511 A | 1/1992 | Tehrani et al. | |
| 5,227,644 A | 7/1993 | Ueno | |
| 5,270,554 A | 12/1993 | Palmour | |
| 5,298,441 A | 3/1994 | Goronkin et al. | |
| 5,399,883 A | 3/1995 | Baliga | |
| 5,643,811 A | 7/1997 | Hasegawa | |
| 5,729,045 A | 3/1998 | Buynoski | |
| 5,821,576 A | 10/1998 | Sriran | |
| 6,274,916 B1 | 8/2001 | Donath et al. | |
| 6,291,085 B1 * | 9/2001 | White et al. | 428/642 |
| 6,316,793 B1 * | 11/2001 | Sheppard et al. | 257/103 |
| 6,342,313 B1 | 1/2002 | White et al. | |
| 6,410,162 B1 * | 6/2002 | White et al. | 428/642 |
| 6,559,068 B2 | 5/2003 | Alok et al. | |
| 6,610,141 B2 * | 8/2003 | White et al. | 117/4 |
| 6,806,157 B2 | 10/2004 | Yang et al. | |
| 6,822,275 B2 | 11/2004 | Harada et al. | |
| 6,906,356 B1 | 6/2005 | Chang | |

* cited by examiner

*Primary Examiner*—Alonzo Chambliss
(74) *Attorney, Agent, or Firm*—Jacob & Kim LLP; David Jacobs

(57) ABSTRACT

An epitaxially layered structure with gate voltage bias supply circuit element for improvement in performance for semiconductor field effect transistor (FET) devices utilizes a structure comprised of a substrate, a first layer semiconductor film of either an n-type or a p-type grown epitaxially on the substrate, with the possibility of a buffer layer between the substrate and first layer film, an active semiconductor layer grown epitaxially on the first semiconductor layer with the conductivity type of the active layer being opposite that of the first semiconductor layer, with the active layer having a gate region and a drain region and a source region with electrical contacts to gate, drain and source regions sufficient to form a FET, an electrical contact on either the substrate or the first semiconductor layer, and a gate voltage bias supply circuit element electrically connected to gate contact and to substrate or first semiconductor layer with voltage polarity and magnitude sufficient to increase device performance. This epitaxially layered structure with gate voltage bias supply circuit element can be employed for improving the function and high frequency performance of semiconductor FET devices.

6 Claims, 6 Drawing Sheets

Electrical contacts to
n-type first Sc layer

HIGH PERFORMANCE FET DEVICES

CROSS REFERENCE AND CLAIM OF PRIORITY

This application for U.S. patent claims priority from Provisional Application for U.S. Patent Ser. No. 60/647,177 filed Jan. 25, 2005, entitled "High-Performance FET Devices and Methods", which is incorporated herein by reference as if set forth in its entirety.

FIELD OF THE INVENTION

This invention relates generally to an epitaxially layered structure with gate voltage bias supply circuit element, for improvements in the performance of semiconductor field effect transistor (FET) devices, and more particularly, to improvements in the high frequency performance of FET devices, as well as methods related to such devices.

BACKGROUND OF THE INVENTION

A field effect transistor (FET) device can be used in an amplifier circuit to increase radio frequency (RF) power. A conventional FET has a simple structure and can be fabricated easily. Gallium arsenide has been used to obtain high frequency performance. Wide bandgap semiconductor materials, such as silicon carbide and gallium nitride, are used to obtain high power performance, especially in adverse operating conditions such as high temperature and high radiation conditions.

The active layer of a FET pertains to the semiconductor layer on which a drain region, a source region and a gate region exist, with the gate region located between the drain and source. Electrical carriers of either n-type or p-type conductivity exist in the active layer, and will move in response to an electric field generated between the source region and the drain region formed thereon, and in response to signal voltage applied to the gate region formed thereon. The active channel is that portion within the active layer in which the electrical carriers move in response to a signal on the gate contact. The speed of a FET pertains to its ability to operate at high frequency, and high carrier mobility is required for high speed response. Enhancements in the ability of a FET to operate at high frequencies increase its functionally and the number of potential applications in which it can be employed. Various designs for epitaxially layered structures have been disclosed to increase performance of FETs at high frequencies, and to extend the maximum frequency at which a FET will operate.

There exist several FET types. For example, a FET may have no intermediate layer between a metal gate contact and the active layer, in which case a metal semiconductor field effect transistor (MESFET) is formed. Alternatively, a FET may further include an additional material layer intermediate between the gate contact and the active layer, to form a junction field effect transistor (JFET), or may include a metal oxide material layer between the gate contact and the active layer to form a metal oxide field effect transistor (MOSFET).

The upper limit for the operating frequency for an epitaxially layered FET can be improved by several methods. It is desirable to have high electron mobility for a FET that has n-type carriers in the active channel. For high frequency applications, the preferred active layer materials have been those having a high saturated electron drift velocity. Because the semiconductor layers of a FET are epitaxial, then the layer upon which each layer is grown affects the overall characteristics of the device (see, e.g., U.S. Pat. No. 5,270,554 to Palmour, incorporated herein by reference).

Various FET and related structures are disclosed in the following U.S. patents, incorporated herein by reference as if set forth in their entireties:

| | |
|---|---|
| Sriran | 5,821,576 |
| Baliga | 5,399,883 |
| Tehrani et al. | 5,081,511 |
| Strifler et al. | 4,935,377 |
| Ueno | 5,227,644 |
| Hasegawa | 5,643,811 |
| Palmour | 5,270,554 |
| Alok et al. | 6,559,068 |
| Yang et al. | 6,806,157 |
| Goronkin et al. | 5,298,441 |
| Buynoski | 5,729,045 |
| Donath et al. | 6,274,916 |

With regard to the present invention, it is noted that a depletion layer region occurs at the interfacial boundary of an n-type semiconductor layer epitaxially grown on a p-type semiconductor layer. The thickness of the depletion layer region can be increased by suitable application of a bias voltage across the n-type and p-type semiconductor layers.

Application of such a voltage bias to control the thickness of the depletion region in a FET that has a first semiconductor layer upon which an active semiconductor layer is epitaxially grown could be made by application of bias voltage between the gate contact and the substrate, provided that: (1) there exists a suitable electrode on the substrate, (2) all layers between the substrate and gate contact were sufficiently and properly conducting, and (3) a suitable gate voltage bias circuit element existed between the gate contact and the substrate electrode.

In similar fashion, application of such a voltage bias to control the thickness of the depletion region in a FET that has a first semiconductor layer upon which an active semiconductor layer is epitaxially grown alternatively could be made by application of bias voltage between the gate contact and the first semiconductor layer, provided that: (1) there exists a suitable electrode on the first semiconductor layer, and (2) a suitable gate voltage bias circuit element existed between the gate contact and the first semiconductor layer electrode.

With regard to the present invention, an epitaxially layered MESFET can be designed to have either n-type material or p-type material in the active layer, with the electrical carriers in the active layer being n-type or p-type, accordingly. The upper limit for the operating frequency for an epitaxially layered MESFET that has p-type carriers in the active layer would be improved by having a higher value for the mobility for p-type carriers that are in close proximity to the gate contact.

Similarly, the upper limit for the operating frequency for an epitaxially layered MESFET that has n-type carriers in the active layer would be improved by having a higher value for the mobility for n-type carriers in the active layer that are in close proximity to the gate contact.

With regard to the present invention, wide bandgap semiconductor materials are useful for device operation at high temperatures. Zinc oxide is a wide bandgap material, and it also possesses good radiation resistance properties. Wide bandgap semiconductor films of zinc oxide are now available in both n-type and p-type carrier types that have properties sufficient for fabrication of semiconductor devices.

In particular, White et al. (U.S. Pat. No. 6,291,085) disclosed a p-type doped zinc oxide film, wherein the film could be incorporated into a semiconductor device including an FET.

In addition, White et al. (U.S. Pat. No. 6,342,313) disclosed a p-type doped metal oxide film having a net acceptor concentration of at least about $10^{15}$ acceptors/cm$^3$, wherein:

(1) the film is an oxide compound of an element selected from the groups consisting of Group 2 (beryllium, magnesium, calcium, strontium, barium and radium), Group 12 (zinc, cadmium and mercury), Group 2 and 12, and Group 12 and Group 16 (oxygen, sulfur, selenium, tellurium and polonium) elements, and (2) wherein the p-type dopant is an element selected from the groups consisting of Group 1 (hydrogen, lithium, sodium, potassium, rubidium, cesium and francium), Group 11 (copper, silver and gold), Group 5 (vanadium, niobium and tantalum) and Group 15 (nitrogen, potassium, arsenic, antimony and bismuth) elements.

Further, White et al. (U.S. Pat. No. 6,410,162) disclosed a p-type doped zinc oxide film, wherein the p-type dopant is selected from Group 1, 11, 5 and 15 elements, and wherein the film is incorporated into a semiconductor device including a FET. This patent also disclosed a p-type doped zinc oxide film, wherein the p-type dopant is selected from Group 1, 11, 5 and 15 elements, and wherein the film is incorporated into a semiconductor device as a substrate material for lattice matching to materials in the device.

Each and all of the above-referenced documents and disclosures are incorporated by reference herein, and made a part of this application for patent, as if set forth in their entireties herein.

The power, efficiency, function and speed of a semiconductor FET device is limited by the mobility of carriers, either n-type or p-type, in the active layer. Silicon carbide and gallium nitride materials are used as materials in FETs to increase performance at high frequency and high power operating conditions. However, such performance is limited due to the low mobility of carriers in the active layer.

Those skilled in the art will appreciate that a higher mobility for carriers in the active layer will improve the performance of a field effect transistor at high frequency.

FET devices that can operate at high speed are desirable for use in many commercial and military sectors, including, but not limited to, areas such as communication networks, radar, sensors and medical imaging.

Therefore, it would be desirable to provide a FET which may be fabricated of wide bandgap semiconductor materials such as zinc oxide, silicon carbide, and gallium nitride, and alloys of each material, and with the FET having an epitaxially layered structure such that the FET has improved performance in function and speed and can be used at high frequencies.

It would also be desirable to provide a FET which may be fabricated of semiconductor materials such as silicon and gallium arsenide, with the FET having an epitaxially layered structure such that the FET has improved performance in function and speed and can be used at high frequencies.

There also exists a need for a FET device that has carriers of n-type with high mobility at room temperature.

Still further, there exists a need for a FET device that has carriers of p-type with high mobility at room temperature.

It would also be desirable to provide a FET device that has carriers with high mobility that that can be utilized at high frequencies.

There also exists a need for a FET for which the thickness of the active channel layer in which carriers move can be adjusted so as to achieve higher carrier mobility.

There also exists a need for an epitaxially layered FET structure with a suitable gate voltage bias supply circuit element that can be employed to adjust the thickness of the active channel layer in which carriers move in close proximity to the gate contact, and to increase the mobility of carriers in the active channel layer in close proximity to the gate electrode.

SUMMARY OF THE INVENTION

The present invention addresses these needs, among other aspects. In particular, one aspect of the invention provides an epitaxially layered structure with a gate voltage bias supply circuit element for improvement in function and speed for semiconductor field effect transistor (FET) devices, and with particular capabilities for operation at high frequencies.

One embodiment of the invention provides a metal semiconductor field effect transistor (MESFET) comprising a single crystal silicon carbide substrate with n-type conductivity, a first epitaxial layer of n-type zinc oxide that is formed upon the substrate, and a second epitaxial layer of p-type zinc oxide that is formed upon the first epitaxial layer. The second epitaxial layer serves as the active layer. Ohmic contacts are formed on each of the two separate regions on the active layer that respectively define one of the regions as the source and the other region as the drain, and a Schottky metal gate contact is positioned upon a portion of the second epitaxial layer that is between the ohmic contacts, and thereby between the source and drain, thereby forming an active layer. Electrical leads are applied to the source and drain contacts, a signal bias is applied to the Schottky contact, and a gate voltage bias supply circuit element provides a bias voltage between the gate contact and to either the substrate or to the first semiconductor layer, to thereby create a voltage across the first semiconductor layer and the active layer that is of proper polarity and of sufficient magnitude to increase the function and high frequency performance of the device.

Without limiting the present invention, it is noted that the application of the gate voltage bias supply circuit element with proper polarity and magnitude increases the thickness of the depletion layer, and thereby reduces the thickness of the active channel layer in close proximity to the gate contact in which p-type carriers flow, thus achieving desirable operating characteristics that provide high mobility for the p-type carriers and high device speed.

Further, it appears for the present invention that the mobility of the p-type carriers in the active channel layer in close proximity to the gate contact exceeds mobility values reported for p-type carriers in thick layers of p-type zinc oxide and in bulk p-type zinc oxide by approximately a factor of 100.

Without limiting the present invention, the increased mobility of the p-type carriers in the confined layer in close proximity to the gate contact may be due to quantum confinement effects associated with reduced dimensionality of the active channel layer in close proximity to the gate contact.

Without limiting the present invention, one explanation for the higher mobility for the p-type carriers in close proximity to the gate contact may result from effects due to confinement in one of the dimensions; namely, the thickness of the active channel layer in close proximity to the gate contact which contains mobile p-type carriers.

Without limiting the present invention, the increased mobility of the p-type carriers in the confined layer in close proximity to the gate contact may be due to decreased scattering from impurities.

Other embodiments and aspects of the present invention are described in detail below and in conjunction with the attached drawing figures. In particular, other details, advantages and features of the invention, and the manner in which operation of FET devices in accordance with the invention is accomplished will become more apparent from the following detailed description of the invention, in conjunction with the accompanying drawings that illustrate exemplary embodiments of the invention.

DETAILED DESCRIPTION OF THE INVENTION

Figure 1:
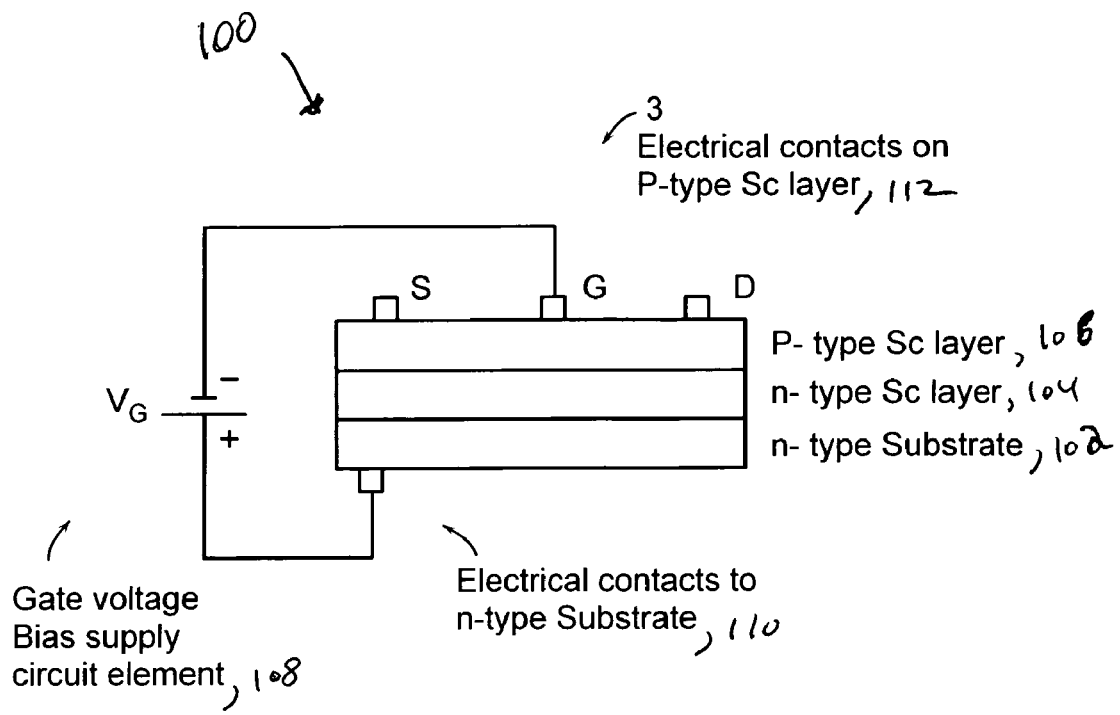
FIG. 1 is a schematic section of a first embodiment of a metal semiconductor field effect transistor (MESFET) in accordance with the present invention. The active layer is a p-type semiconductor material, and the gate voltage bias supply circuit element, herein represented by the symbol for a battery, is between the gate contact and the n-type substrate.

FIG. 1 illustrates a first embodiment 100 of an FET according to the present invention. A first semiconductor layer of n-type conductivity 104 is epitaxially grown upon a single crystal substrate of n-type conductivity 102. A second semiconductor layer of p-type conductivity 106 is epitaxially grown upon the first semiconductor n-type layer. A gate region G, a drain region D and a source region S are defined on the second semiconductor p-type layer 106, with the gate region G located between the source region S and drain region D. Ohmic electrical contacts 112 are formed on the source and drain regions. A gate contact is formed on the gate region G, thereby forming an active layer with p-type carriers. A drain voltage is applied between the source and drain to form an electric field in the active layer. The substrate is prepared for an electrical contact and an electrical contact is formed on the n-type substrate, sufficient to allow a gate voltage bias supply circuit element to be connected between the gate contact and the n-type substrate, with voltage polarity such that the gate contact is negative with respect to the n-type substrate. The magnitude of the gate voltage bias is adjusted sufficient to increase performance characteristics of the device.

Figure 2:
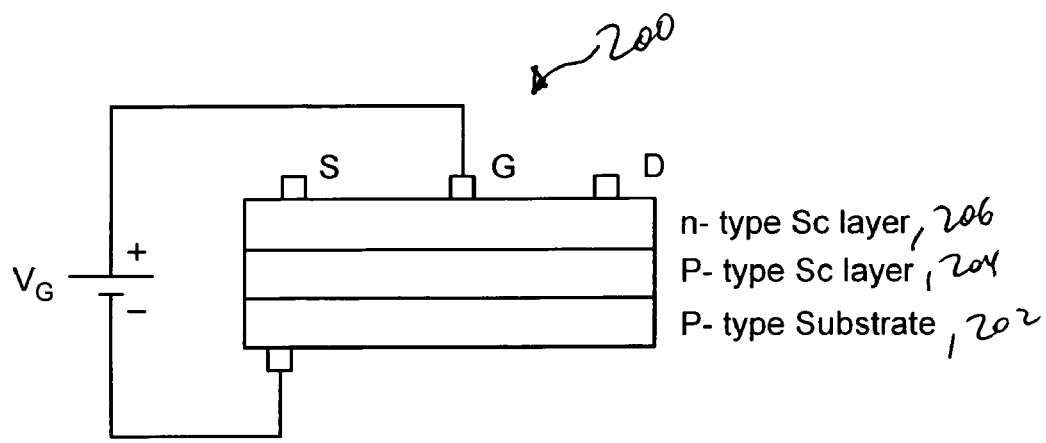
FIG. 2 is a schematic section of a second embodiment of a MESFET in accordance with the present invention. The active layer is an n-type semiconductor material, and the gate voltage bias supply circuit element is between the gate contact and the p-type substrate.

FIG. 2 illustrates a second embodiment 200 of an FET according to the present invention. A first semiconductor layer of p-type conductivity 204 is epitaxially grown upon a single crystal substrate of p-type conductivity 202. A second semiconductor layer of n-type conductivity 206 is epitaxially grown upon the first semiconductor p-type layer 204. A gate region G, a drain region D and a source region S are defined on the second semiconductor n-type layer 206, with the gate region G located between the source region S and the drain region D. Ohmic electrical contacts are formed on the source and drain regions. A gate contact is formed on the gate region, thereby forming an active layer with n-type carriers. A drain voltage is applied between the source and drain to form an electric field in the active layer. The substrate is prepared for an electrical contact, and an electrical contact is formed on the p-type substrate, sufficient to allow a gate voltage bias supply circuit element to be connected between the gate contact and the p-type substrate, with voltage polarity such that the gate contact is positive with respect to the p-type substrate. The magnitude of the gate voltage bias is adjusted sufficient to increase performance characteristics of the device.

Figure 3:
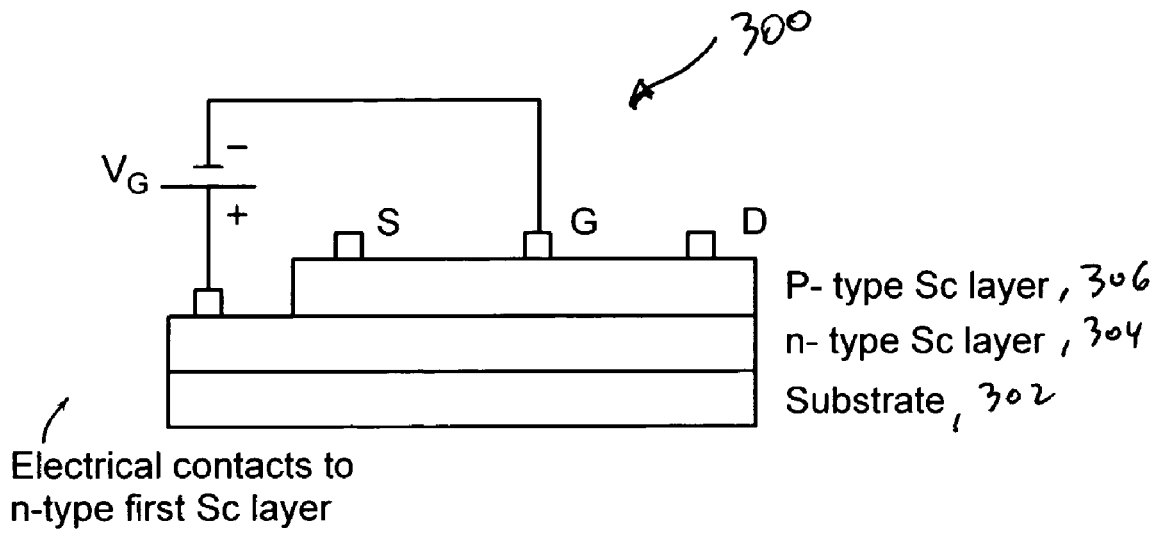
FIG. 3 is a schematic section of a third embodiment of a MESFET in accordance with the present invention. The active layer is a p-type semiconductor material, and the gate voltage bias supply circuit element is between the gate contact and the n-type first semiconductor layer.

FIG. 3 illustrates a third embodiment 300 of an FET according to the present invention. A first semiconductor layer of n-type conductivity 304 is epitaxially grown upon a single crystal substrate 302. A second semiconductor layer of p-type conductivity 306 is epitaxially grown upon the first semiconductor n-type layer 304. A gate region G, a drain region D and a source region S are defined on the second semiconductor p-type layer 306, with the gate region G located between the source region S and drain region D. Ohmic electrical contacts are formed on the source and drain regions. A gate contact is formed on the gate region thereby forming an active layer with p-type carriers. A drain voltage is applied between the source and drain to form an electric field in the active layer. The first semiconductor n-type layer is prepared for an electrical contact, and an electrical contact is formed on the first semiconductor n-type layer sufficient for allowing a gate voltage bias supply circuit element to be connected between the gate contact and the first semiconductor n-type layer, with voltage polarity such that the gate contact is negative with respect to the first semiconductor n-type layer. The magnitude of the gate voltage bias is adjusted sufficient to increase performance characteristics of the device.

Figure 4:
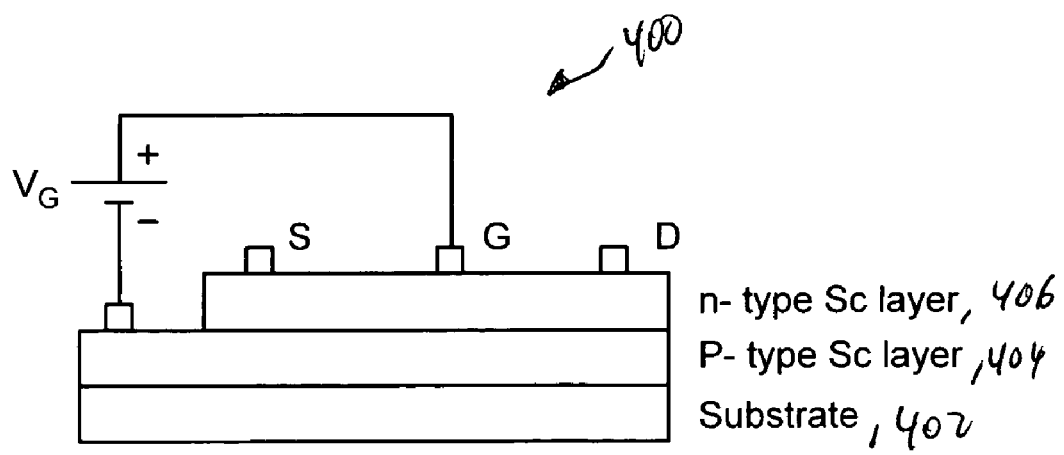
FIG. 4 is a schematic section of a fourth embodiment of a MESFET in accordance with the present invention. The active layer is an n-type semiconductor material, and the gate voltage bias supply circuit element is between the gate contact and the p-type first semiconductor layer.

FIG. 4 illustrates a fourth embodiment 400 of the FET according to the present invention. A first semiconductor layer of p-type conductivity 404 is epitaxially grown upon a single crystal substrate 402. A second semiconductor layer of n-type conductivity 406 is epitaxially grown upon the first semiconductor p-type layer 404. A gate region G, a drain region D and a source region S are defined on the second semiconductor n-type layer 406 with the gate region G located between the source region S and drain region D. Ohmic electrical contacts are formed on the source and drain regions. A gate contact is formed on the gate region, thereby forming an active layer with n-type carriers. A drain voltage is applied between the source and drain to form an electric field in the active layer. The first semiconductor p-type layer is prepared for an electrical contact, and an electrical contact is formed on the first semiconductor p-type layer sufficient for allowing a gate voltage bias supply circuit element to be connected between the gate contact and the first semiconductor p-type layer, with voltage polarity such that the gate contact is positive with respect to the first semiconductor p-type layer. The magnitude of the gate voltage bias is adjusted sufficient to increase performance characteristics of the device.

Figure 5:
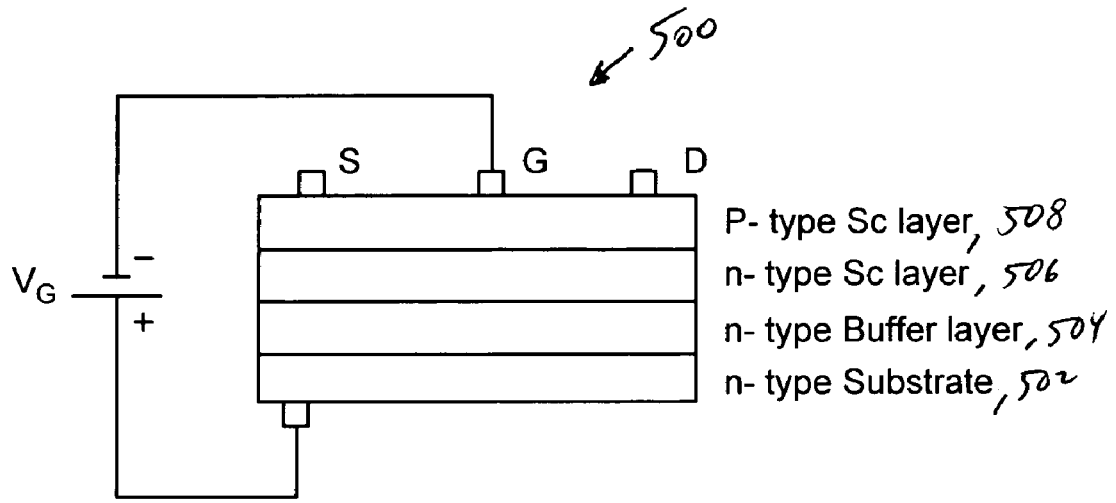
FIG. 5 is a schematic section of a fifth embodiment of a MESFET in accordance with the present invention. The active layer is a p-type semiconductor layer. An n-type buffer layer is between the n-type substrate and the n-type first semiconductor layer. The gate voltage bias supply circuit element is between the gate contact and the n-type substrate.

FIG. 5 illustrates a fifth embodiment 500 of an FET according to the present invention. A buffer layer of n-type conductivity 504 is grown on an n-type single crystal substrate 502. A first semiconductor layer of n-type conductivity 506 is epitaxially grown upon the n-type buffer layer 504. A second semiconductor layer of p-type conductivity 508 is epitaxially grown upon the first semiconductor n-type layer 506. A gate region G, a drain region D and a source region S are defined on the second semiconductor p-type layer 508 with the gate region G located between the source region S and drain region D. Ohmic electrical contacts are formed on the source and drain regions. A gate contact is formed on the gate region, thereby forming an active layer with p-type carriers. A drain voltage is applied between the source and drain to form an electric field in the active layer. The substrate is prepared for an electrical contact, and an electrical contact is formed on the n-type substrate, sufficient to allow a gate voltage bias supply circuit element to be connected between the gate contact and the n-type substrate, with voltage polarity such that the gate contact is negative with respect to the n-type substrate. The magnitude of the gate voltage bias is adjusted sufficient to increase performance characteristics of the device.

Figure 6:
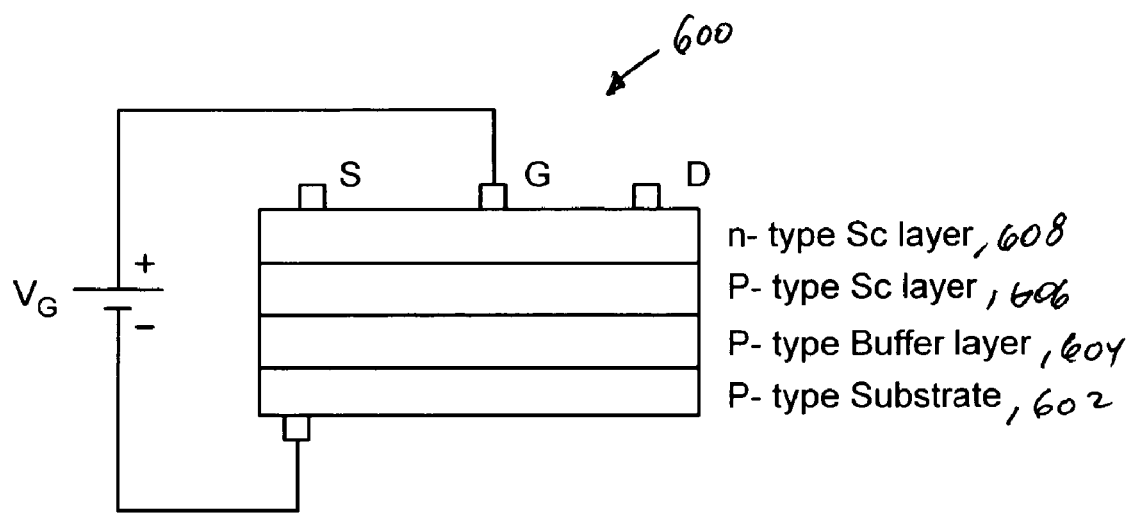
FIG. 6 is a schematic section of a sixth embodiment of a MESFET in accordance with the present invention. The active layer is an n-type semiconductor layer. A p-type buffer layer is between the p-type substrate and the p-type first semiconductor layer. The gate voltage bias supply circuit element is between the gate contact and the p-type substrate.

FIG. 6 illustrates a sixth embodiment 600 of the FET according to the present invention. A buffer layer of p-type conductivity 604 is grown on a p-type single crystal substrate 602. A first semiconductor layer of p-type conductivity 606 is epitaxially grown upon the p-type buffer layer 604. A second semiconductor layer of n-type conductivity 608 is epitaxially grown upon the first semiconductor p-type layer 606. A gate region G, a drain region D and a source region S are defined on the second semiconductor n-type layer 608, with the gate region G located between the source region S and drain region D. Ohmic electrical contacts are formed on the source and drain regions. A gate contact is formed on the gate region, thereby forming an active layer with n-type carriers. A drain voltage is applied between the source and drain to form an electric field in the active layer. The substrate is prepared for an electrical contact, and an electrical contact is formed on the p-type substrate, sufficient for allowing a gate voltage bias supply circuit element to be connected between the gate contact and the p-type substrate with voltage polarity such that the gate contact is positive with respect to the p-type substrate. The magnitude of the gate voltage bias is adjusted sufficient to increase performance characteristics of the device.

Figure 7:
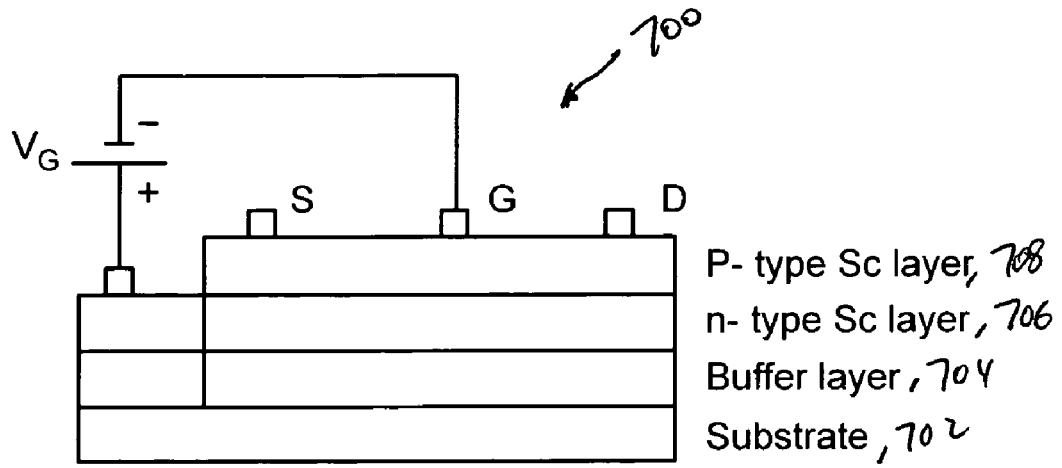
FIG. 7 is a schematic section of a seventh embodiment of a MESFET in accordance with the present invention. The active layer is a p-type semiconductor layer. A buffer layer is between the substrate and the n-type first semiconductor layer. The gate voltage bias supply circuit element is between the gate contact and the n-type first semiconductor layer.

FIG. 7 illustrates a seventh embodiment 700 of the FET according to the present invention. A buffer layer 704 is grown on a single crystal substrate 702. A first semiconductor layer of n-type conductivity 706 is epitaxially grown upon the buffer layer 704. A second semiconductor layer of p-type conductivity 708 is epitaxially grown upon the first semiconductor n-type layer 706. A gate region G, a drain region D and a source region S are defined on the second semiconductor p-type layer 708 with the gate region G located between the source region S and drain region D. Ohmic electrical contacts are formed on the source and drain regions. A gate contact is formed on the gate region, thereby forming an active layer with p-type carriers. A drain voltage is applied between the source and drain to form an electric field in the active layer. The first semiconductor n-type layer is prepared for an electrical contact, and an electrical contact is formed on the first semiconductor n-type layer, sufficient to allow a gate voltage bias supply circuit element to be connected between the gate contact and the first semiconductor n-type layer, with voltage polarity such that the gate contact is negative with respect to the first semiconductor n-type layer. The magnitude of the gate voltage bias is adjusted sufficient to increase performance characteristics of the device.

Figure 8:
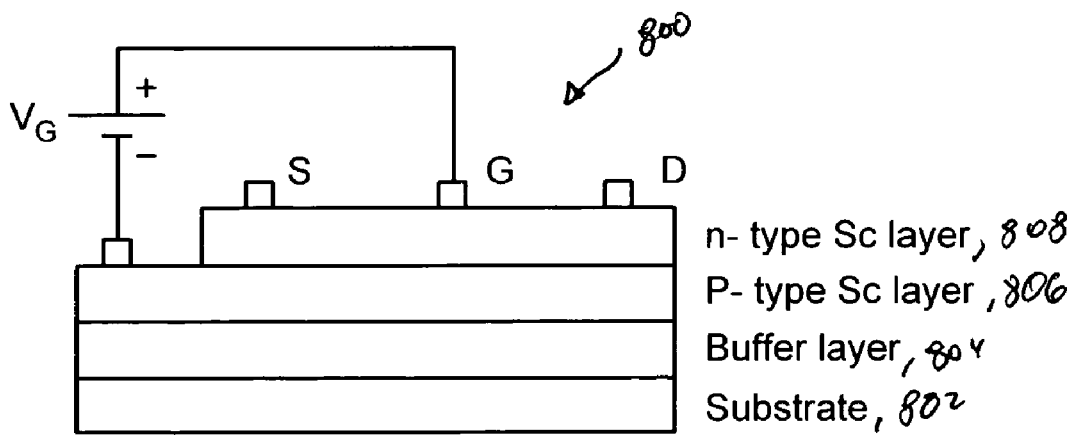
FIG. 8 is a schematic section of an eighth embodiment of a MESFET in accordance with the present invention. The active layer is an n-type semiconductor layer. A p-type buffer layer is between the substrate and the p-type first semiconductor layer. The gate voltage bias supply circuit element is between the gate contact and the p-type first semiconductor layer.

FIG. 8 illustrates an eighth embodiment 800 of the FET according to the present invention. A buffer layer 804 is grown on a single crystal substrate 802. A first semiconductor layer of p-type conductivity 806 is epitaxially grown upon the buffer layer 804. A second semiconductor layer of n-type conductivity 808 is epitaxially grown upon the first semiconductor p-type layer 806. A gate region G, a drain region D and a source region S are defined on the second semiconductor n-type layer 808 with the gate region G located between the source region S and drain region D. Ohmic electrical contacts are formed on the source and drain regions. A gate contact is formed on the gate region, thereby forming an active layer with n-type carriers. A drain voltage is applied between the source and drain to form an electric field in the active layer. The first semiconductor p-type layer is prepared for an electrical contact, and an electrical contact is formed on the first semiconductor p-type layer, sufficient for allowing a gate voltage bias supply circuit element to be connected between the gate contact and the first semiconductor p-type layer, with voltage polarity such that the gate contact is positive with respect to the first semiconductor p-type layer. The magnitude of the gate voltage bias is adjusted sufficient to achieve increased operating performance characteristics of the device.

Figure 9:
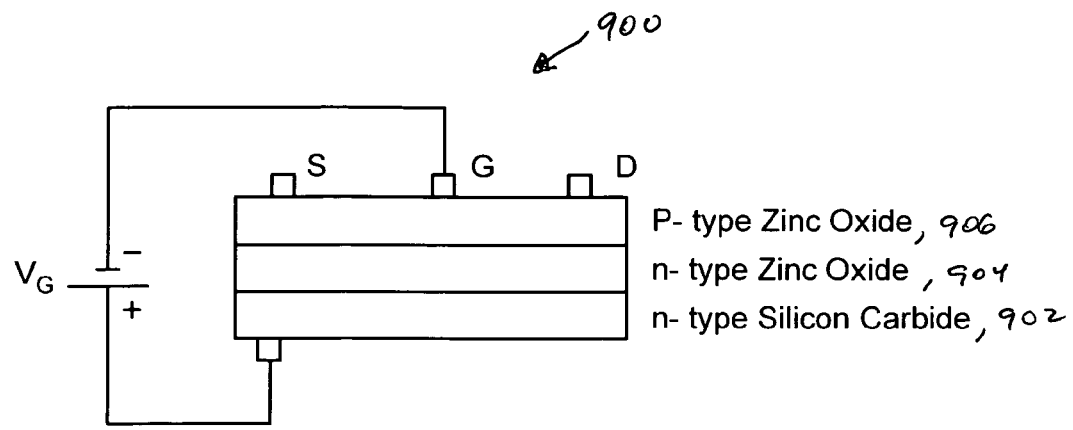
FIG. 9 illustrates a particular embodiment of the invention configured for operation as a MESFET to achieve high speed performance. The substrate is n-type silicon carbide. The first semiconductor layer is intrinsic n-type zinc oxide. The second semiconductor layer is the active layer and is p-type zinc oxide doped with arsenic. An electrical contact was formed on the n-type substrate for allowing a gate voltage bias supply circuit element to be connected between the gate contact and the n-type substrate, with voltage polarity such that the gate contact was negative with respect to the n-type substrate. Fabricated devices were then tested for current and voltage characteristics. The magnitude of the gate voltage bias was adjusted sufficient to increase performance characteristics.

FIG. 9 illustrates a particular embodiment (900) of the invention configured for operation as a MESFET to achieve high speed performance. The substrate is n-type silicon carbide. The first semiconductor layer 904 is intrinsic n-type zinc oxide. The second semiconductor layer 906 is the active layer and is p-type zinc oxide doped with arsenic. An electrical contact is formed on the n-type substrate for allowing a gate voltage bias supply circuit element to be connected between the gate contact and the n-type substrate, with voltage polarity such that the gate contact was negative with respect to the n-type substrate. Fabricated devices can then be tested for current and voltage characteristics. The magnitude of the gate voltage bias can be adjusted sufficiently to increase performance characteristics.

Based on the description herein and the attached drawings, those skilled in the art will readily understand the present invention, including the following aspects. In the attached drawing figures, the gate voltage bias supply circuit element is denoted by the symbol for a battery. One skilled in the art will appreciate that a battery or an electronic power supply or other suitable voltage source may be used as appropriate.

In another aspect of the invention, if no buffer layer exists between the substrate and the first semiconductor n-type layer, then the epitaxial structure can be prepared with the substrate being n-type and selected from the group silicon carbide, zinc oxide, gallium nitride, gallium arsenide and silicon.

Similarly, if no buffer layer exists between the substrate and the first semiconductor p-type layer, then the epitaxial structure can be prepared with the substrate being p-type and selected from the group silicon carbide, zinc oxide, gallium nitride, gallium arsenide and silicon.

In another aspect of the invention, if no buffer layer exists between the substrate and the first semiconductor n-type layer, then the epitaxial structure can be prepared with the substrate being n-type, such that the n-type substrate and the n-type first semiconductor layer comprise one entity.

If no buffer layer exists between the substrate and the first semiconductor p-type layer, then the epitaxial structure can be prepared with the substrate being p-type, such that the p-type substrate and the p-type first semiconductor layer comprise one entity.

If an n-type buffer layer exists between the n-type substrate and the first semiconductor n-type layer, then the epitaxial structure can be prepared with the substrate being n-type and selected from the group silicon carbide, zinc oxide, gallium nitride, gallium arsenide and silicon.

In another aspect of the invention, if a p-type buffer layer exists between the p-type substrate and the first semiconductor p-type layer, then the epitaxial structure can be prepared with the substrate being p-type and selected from the group silicon carbide, zinc oxide, gallium nitride, gallium arsenide and silicon.

In a further aspect of the invention, if the gate voltage bias supply circuit element makes electrical contact to a contact located on the first semiconductor layer, then the epitaxial structure can be prepared with the substrate being selected from the group silicon carbide, zinc oxide, gallium nitride, sapphire, gallium arsenide and silicon.

In another aspect of the invention, if the gate voltage bias supply circuit element is to be connected between the gate contact and the first semiconductor p-type layer, then the epitaxial structure can be prepared with the substrate selected from the group silicon carbide, zinc oxide, gallium nitride, gallium arsenide, silicon and sapphire.

In still another aspect of the invention, if the gate voltage bias supply circuit element is to be connected between the gate contact and the first semiconductor n-type layer, then the epitaxial structure can be prepared with the substrate selected from the group silicon carbide, zinc oxide, gallium nitride, gallium arsenide, silicon and sapphire.

In a further aspect of the invention, the epitaxial structure can be prepared with a Schottky metal semiconductor barrier as the gate contact on the active layer, to form a MESFET.

Alternatively, the epitaxial structure can be prepared with a material layer located between the gate contact and the second semiconductor layer to form a junction field effect transistor JFET.

In another aspect of the invention, the epitaxial structure can be prepared with a material layer located between the gate contact and the second semiconductor layer to form a MOSFET.

The epitaxial structure can also be prepared with the first semiconductor layer being an n-type material selected from the group zinc oxide, zinc oxide alloys, gallium nitride, gallium nitride alloys, gallium arsenide and gallium arsenide alloys, silicon carbide and silicon carbide alloys, and silicon; and the second semiconductor layer a p-type material selected from the group zinc oxide, zinc oxide alloys, gallium nitride, gallium nitride alloys, gallium arsenide and gallium arsenide alloys, silicon carbide and silicon carbide alloys, and silicon.

Alternatively, the epitaxial structure can be prepared with the first semiconductor layer being a p-type material selected from the group zinc oxide, zinc oxide alloys, gallium nitride, gallium nitride alloys, gallium arsenide and gallium arsenide alloys, silicon carbide and silicon carbide alloys, and silicon; and the second semiconductor layer an n-type material selected from the group zinc oxide, zinc oxide alloys, gallium nitride, gallium nitride alloys, gallium arsenide and gallium arsenide alloys, silicon carbide and silicon carbide alloys, and silicon.

In another aspect of the present invention, the epitaxial structure can be prepared with the first semiconductor layer being an n-type zinc oxide material and the second semiconductor layer a p-type zinc oxide material.

In another aspect of the invention, the epitaxial structure can be prepared with the substrate being an n-type zinc oxide, such that the n-type zinc oxide substrate and the n-type zinc oxide first semiconductor layer comprise one entity.

Alternatively, the epitaxial structure can be prepared with the first semiconductor layer being a p-type zinc oxide material and the second semiconductor layer an n-type zinc oxide material.

The epitaxial structure can be prepared with the substrate being a p-type zinc oxide, such that the p-type zinc oxide substrate and the p-type zinc oxide first semiconductor layer comprise one entity.

In another aspect of the invention, the epitaxial structure can be prepared such that the dopant for the n-type zinc oxide semiconductor layer is an element, or more than one element, selected from the group consisting of boron, aluminum, gallium, indium, thallium, fluorine, chlorine, bromine and iodine.

In another aspect of the invention, the epitaxial structure can be prepared such that the dopant for the p-type zinc oxide semiconductor layer is an element, or more than one element, selected from the group 1, 11, 5 and 15 elements.

The epitaxial structure can be prepared such that the dopant for the p-type zinc oxide semiconductor layer is selected from the group consisting of arsenic, phosphorus, antimony and nitrogen; or, in a particular aspect of the invention, the dopant for the p-type zinc oxide semiconductor layer may be arsenic alone.

In a further aspect of the invention, the epitaxial structure can be prepared such that the dopant for the n-type zinc oxide substrate is an element, or more than one element, selected from the group consisting of boron, aluminum, gallium, indium, thallium, fluorine, chlorine, bromine and iodine.

Alternatively, the epitaxial structure can be prepared such that the dopant for the p-type zinc oxide substrate is an element, or more than one element, selected from the group 1, 11, 5 and 15 elements; or an element, or more than one element, selected from the group consisting of arsenic, phosphorus, antimony and nitrogen; or particularly, arsenic alone.

The invention and its technical advantages will be still further illustrated and understood through the following examples.

EXAMPLES

Description is now provided of particular embodiments of the present invention and their characteristics. As noted above, the present invention relates to an epitaxially layered structure with gate voltage bias supply circuit element for improvements in performance of FET devices, and particularly their high frequency performance.

Although a particular embodiment is next described with respect to a MESFET, it will be understood that the present invention may be practiced with respect to other types of FETs, such as, for example, MOSFETs, JFETs and other configurations and FET types, as noted elsewhere in this document.

In one embodiment of this invention, a polished silicon carbide wafer of n-type conductivity cut from a bulk silicon carbide crystal was used as the substrate. The wafer was placed in a hybrid beam deposition reactor, and heated to approximately 750° C. The pressure was reduced to approximately $1\times10^{-5}$ torr and the substrate cleaned with an RF oxygen plasma for 30 minutes. The temperature was then lowered to 650° C. and then a first layer of intrinsic n-type zinc oxide was deposited to a thickness of approximately 0.3 microns on the silicon carbide substrate. Then the temperature was lowered to 550° C. and a second semiconductor layer comprising p-type zinc oxide doped with the element arsenic was deposited on the first semiconductor layer. The total thickness of the deposited p-type zinc oxide layer doped with arsenic was approximately 0.3 micron.

(A more detailed description of an exemplary process for depositing a zinc oxide layer, an n-type zinc oxide layer, and a p-type zinc oxide layer, and in particular a p-type zinc oxide layer doped with arsenic, is set forth in commonly owned patents White et al. (U.S. Pat. No. 6,475,825), White et al. (U.S. Pat. No. 6,610,141), and Ryu et al. (PCT Patent Application No. PCT/US03/27143). The referenced PCT application describes hybrid beam deposition techniques for depositing an n-type zinc oxide layer and a p-type zinc oxide layer doped with arsenic. Each and all of the above-noted disclosures and documents are incorporated by reference herein, and made a part of this application, as if set forth in their entireties herein.)

The wafer with deposited layers was then removed from the reactor. Ohmic electrical contacts were made to the p-type zinc oxide layer doped with arsenic at spaced and separate source and drain regions, to respectively form a source contact and drain contacts. A metal semiconductor Schottky barrier was formed at the gate contact located between the source contact and drain contact. The ohmic contacts to the drain and were made with Ni and Ti metals. A Schottky contact was made on the active layer between the source and drain contacts to form a MESFET. The ratio of the gate width to the gate length of the MESFET was about 5, and the gate thickness was very thin, in the range 10 to 150 nm.

A drain voltage $V_D$ was applied between the source and drain contacts to form an electric field in the active layer. The substrate was then prepared for an electrical contact, and an electrical contact was formed on the n-type substrate sufficient for allowing a gate voltage bias supply circuit element to be connected between the gate contact and the n-type substrate with voltage polarity such that the gate contact was negative with respect to the n-type substrate.

FIG. 9 illustrates the device configured for operation of as a MESFET to achieve high speed performance. The fabricated MESFET with p-type active layer was tested for current and voltage characteristics. The magnitude of the gate voltage bias $V_G$ was adjusted sufficient to increase performance characteristics, and in particular to increase performance at high frequencies.

Figure 10:
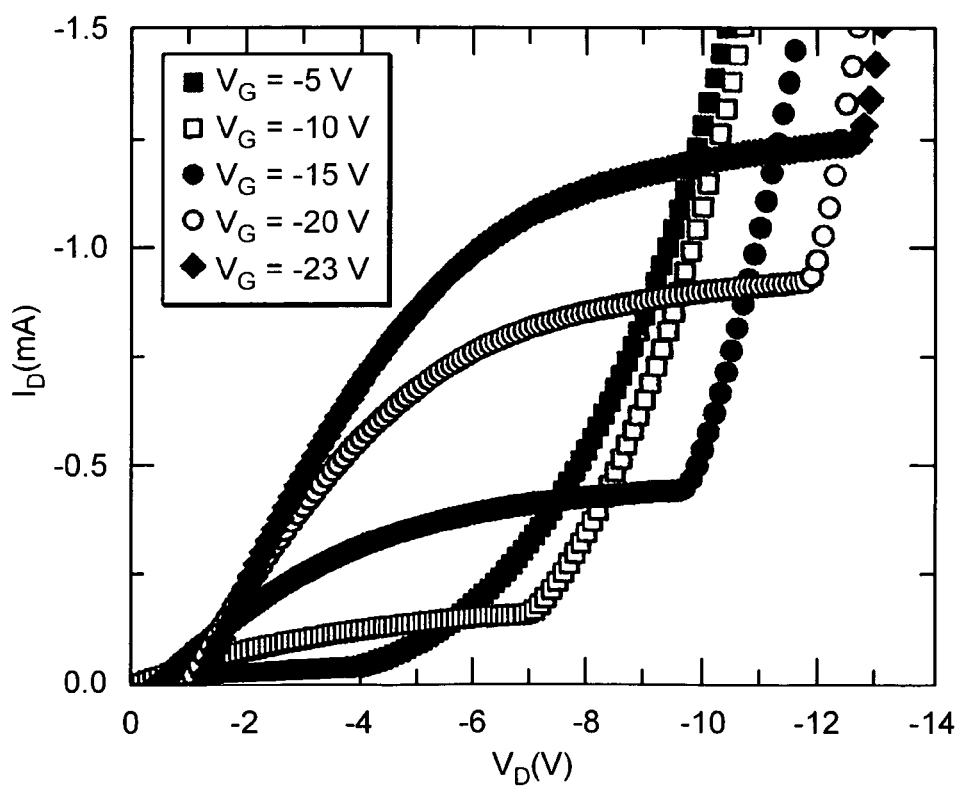
FIG. 10 shows drain current $I_D$ versus drain voltage $V_D$ characteristics for selected values for the gate bias voltage $V_G$, which is the voltage supplied to the gate contact with respect to the n-type substrate by the gate voltage bias supply circuit element, for the above-noted first embodiment of a MESFET in accordance with the present invention. The active layer is p-type zinc oxide doped with arsenic.

FIG. 10 shows drain current $I_D$ versus drain voltage $V_D$ characteristics for selected values for the voltage $V_G$, which is the voltage supplied to the gate contact with respect to the n-type substrate by the gate voltage bias supply circuit element for the above-referenced first embodiment of a MESFET in accordance with the invention. Pinch-off and breakdown voltages locations are clearly observed as the drain voltage $V_D$ is increased. The absolute amplitudes of the drain current ($I_D$) and $V_D$ at breakdown are increased as the gate voltage ($V_G$) is negatively increased.

Figure 11:
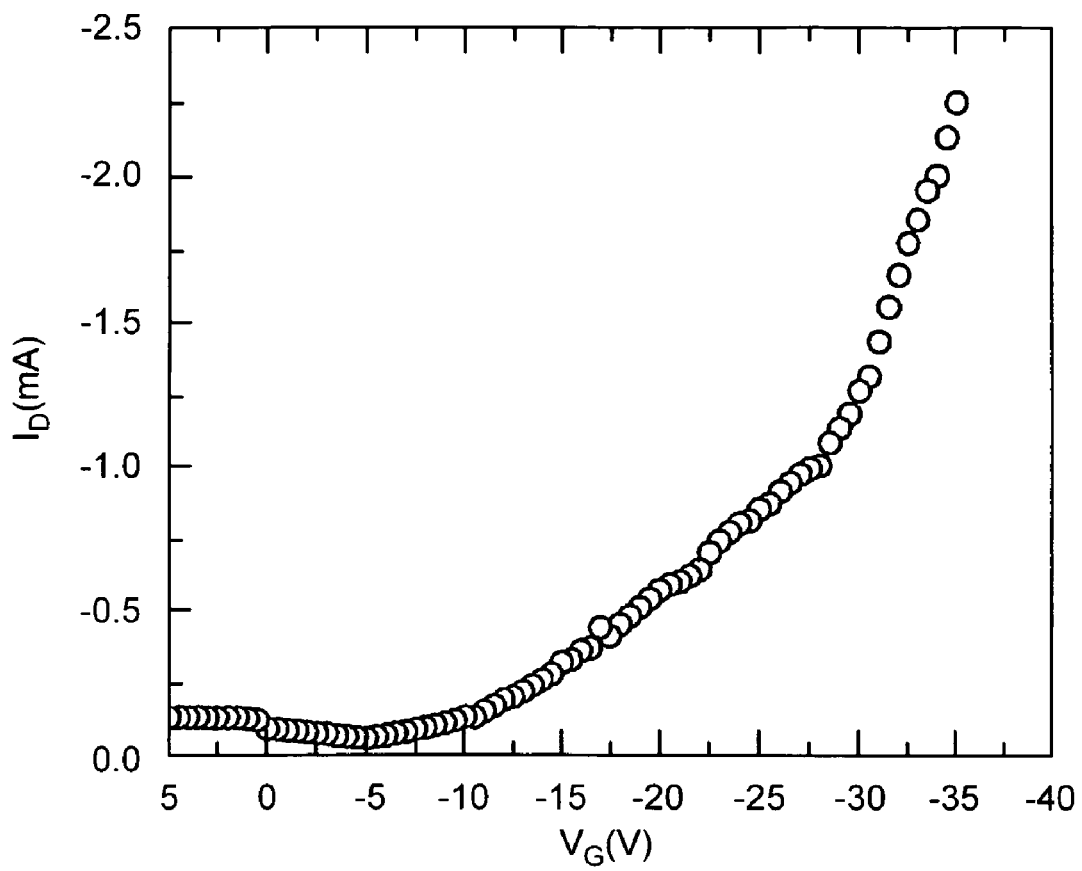
FIG. 11 shows drain current $I_D$ versus gate bias voltage $V_G$, which is the voltage supplied to the gate contact with respect to the n-type substrate by the gate voltage bias supply circuit element, for the first embodiment of a field effect transistor (MESFET) in accordance with the present invention. The drain voltage $V_D$ is −5 volts. The active layer is p-type zinc oxide doped with arsenic.

FIG. 11 shows drain current $I_D$ versus gate bias voltage $V_G$ for the MESFET. The drain voltage $V_D$ is −5 volts.

The increase in mobility of carriers in the active channel layer is evident from analysis of the current versus voltage data for the MESFET as shown. A fit of the data in FIG. 11 yields a mobility value for the p-type carriers of approximately 1000 $cm^2$/V-s. This value is approximately 100 times, more or less, the values reported in the literature for the mobility of p-type carriers in bulk p-type zinc oxide.

Under operating conditions, the mobility of the carriers in the active channel layer in close proximity to the gate contact in the illustrated MESFET, fabricated with a p-type zinc oxide active layer doped with arsenic, exceeds the mobility of p-type carriers in thick layers of p-type zinc oxide doped with arsenic and in bulk material of p-type zinc oxide doped with arsenic.

Without limiting the present invention, an estimate can be made for the maximum frequency that one might expect the device of the present invention could be operated. In particular, from the value of the mobility of the p-type carriers observed with the present invention it is possible to estimate the speed of the device in terms of maximum frequency of operation. For the MESFET data shown in FIGS. 10 and 11, the gate length is approximately 3 microns, defined to be the distance of the metal gate contact along the direction of carrier flow. The source contact to drain contact distance is approximately twice this distance; however, for purposes of this estimation it is not unreasonable to assume that the voltage drop of 5 volts across the drain and source contacts can be assumed to be the voltage drop across the contact gate length. This assumption yields an electric field under the gate contact of approximately $1.6\times10^4$ V/cm. From this result and the determined mobility value, the transit time for a p-type carrier under the gate is found to be approximately $2\times10^{-11}$s. This transit time corresponds to an operational frequency of $5\times10^{10}$ Hz; namely, 50 GHz.

Without limiting the present invention, it is not unreasonable for one skilled in the art to fabricate a device with a gate length of 0.1 microns. It is also not unreasonable to apply a voltage between the source contact and drain contact of 10 volts. These two changes would increase the frequency response performance of a device according to the present invention by a factor of approximately 60, yielding a corresponding operational frequency of $3 \times 10^{12}$ Hz; namely, 3 THz.

The current versus voltage behavior shown is that associated with a normally-off, or so-called "enhancement type" MESFET with a p-type active channel layer. A normally-off zinc oxide MESFET would have unique uses in high-speed device applications in photonic and electronic areas. Such uses would include, but would not be limited to, applications such as high frequency radar, biomedical imaging, chemical compound identification, molecular identification and structure, sensors, imaging systems, and fundamental studies of atoms, molecules, gases, vapors and solids.

Without limiting the present invention, it seems reasonable that the effect of the voltage provided by the gate voltage bias supply circuit element between the substrate contact and the gate contact of the first above-described embodiment of the present invention, changes the thickness of the depletion region of the p-n junction formed by the first semiconductor layer of n-type zinc oxide and the active layer composed of p-type zinc oxide doped with arsenic.

Figure 12:
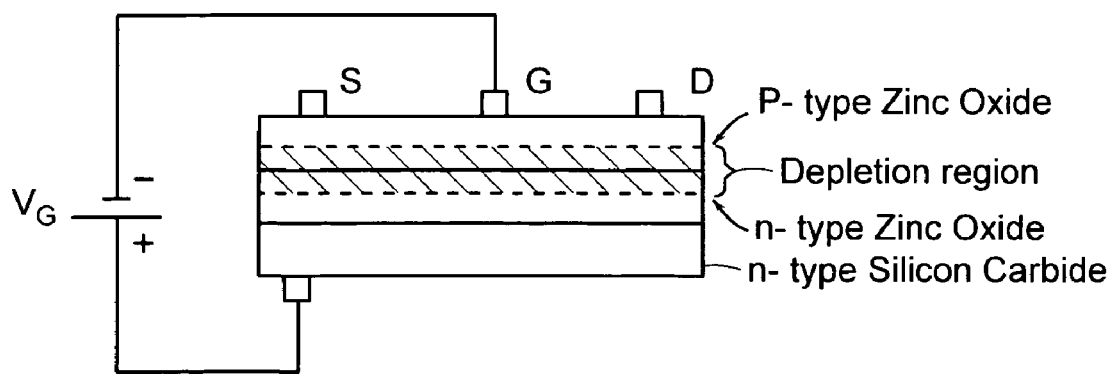
FIG. 12 shows, for the above-referenced first embodiment of the present invention, the depletion region which is located at the region of the interface of the n-type zinc oxide first semiconductor layer, and the p-type semiconductor layer, which is the active layer.

FIG. 12 illustrates schematically the depletion region which is located at the interface of the n-type zinc oxide first semiconductor layer and the p-type semiconductor layer, which is the active layer of the first embodiment of the present invention. An increased thickness for this depletion region will reduce the thickness of the active channel layer in which carriers transit in response to the electric field created by the voltage applied to the source and drain regions. By application of the voltage provided by the gate voltage bias supply circuit element of proper polarity and magnitude, the thickness of the active channel layer beneath the gate contact can be made sufficiently small so that mobility is increased for the p-type carriers in close proximity to the gate contact.

Without limiting the present invention, it is not unreasonable that the same decreased thickness for the active channel layer beneath the gate contact achieved with an active layer of p-type semiconductor material could also be achieved for other wide bandgap semiconductor materials, such as silicon carbide and its alloys, gallium nitride and its alloys, and other semiconductor materials such as gallium arsenide and its alloys, and silicon.

Still further, without limiting the present invention, it is not unreasonable that the same decreased thickness for the active channel layer beneath the gate contact that may be achieved with an active layer of n-type semiconductor material zinc oxide, may also be achieved for other wide bandgap semiconductor materials such as silicon carbide and its alloys, gallium nitride and its alloys, and for other semiconductor materials such as gallium arsenide and its alloys, and silicon.

Also without limiting the present invention, when devices in accordance with the invention are operated to achieve increased high frequency performance it appears not unreasonable to interpret the increased mobility of p-type carriers in the active channel layer in close proximity to the gate contact to be due to effects associated with one effect or a combination of effects from the group consisting of: reduced dimensionally of the active channel layer, reduced impurity scattering for p-type carriers in the active channel layer, and quantum confinement effects.

A FET structure in accordance with the invention, having the disclosed epitaxially layered structure and gate voltage bias supply circuit element, can be used to improve FET performance, and in particular, high frequency performance.

Those skilled in the art should be able to fabricate an FET of the present invention, in accordance with the disclosure herein, with additional desirable features, such as a shorter length for the gate contact, where such length is measured along the direction of current between the drain contact and the source contact, suitably added insulating layers, and suitably added mesas to help reduce current leakages. It is expected that such a FET could be operated at frequencies in excess of 100 GHz, and even in excess of 1 THz.

Without limiting the present invention, a FET according to the invention, with a gate voltage bias supply circuit element, and operated to achieve improved performance, can be referred to as a biased gate field effect transistor (BGFET).

The foregoing examples are set forth by way of illustration and not limitation. Similarly, the terms and expressions used herein are used as terms of description and not of limitation, and there is no intention in the use of such terms and expressions of excluding equivalents of the features shown and described, or portions thereof. Various additions, subtractions, and modifications are possible and are within the spirit and scope of the present invention.

Moreover, any one or more features of any embodiment of the invention described herein or otherwise within the scope of the invention may be combined with any one or more other features of any other embodiment of the invention, without departing from the scope of the invention.

We claim:

1. A field effect transistor (FET) with an epitaxially layered structure comprising:
   a single crystal substrate of a selected conductivity type, the selected conductivity type being either n-type or p-type;
   a first semiconductor layer on the substrate, or on a buffer layer between the substrate and the first semiconductor layer, the first semiconductor layer being of the same conductivity type as that of the substrate or the buffer layer;
   a second, active semiconductor layer on the first semiconductor layer, the conductivity type of the second, active layer being opposite that of the first semiconductor layer;
   wherein at least one of the first or second semiconductor layers contains zinc oxide or an alloy of zinc oxide;
   two electrical contacts on the second semiconductor layer to form respectively a source contact and a drain contact;
   a gate contact on the second semiconductor layer located between the source contact and the drain contact to form an active channel layer;
   an electrical contact formed on a selected one of the substrate, the buffer layer or the first semiconductor layer; and
   a gate voltage bias supply circuit element operable to be connected to (1) the electrical contact formed on a selected one of the substrate, the buffer layer or the first semiconductor layer, and (2) the gate contact, with polarity and magnitude sufficient to increase the high frequency response and operational performance of the FET.

2. The FET of claim 1 wherein the conductivity type of the substrate or buffer layer is n-type, the conductivity type of the first semiconductor layer is n-type, and the conductivity type of the second semiconductor layer is p-type.

3. The FET of claim 1 wherein the conductivity type of the substrate or buffer layer is p-type, the conductivity type of the first semiconductor layer is p-type, and the conductivity type of the second semiconductor layer is n-type.

4. The FET of claim 1 further comprising a Schottky metal semiconductor gate contact on the active channel layer to form a MESFET.

5. The FET of claim 1 further comprising a material layer intermediate the gate contact and the active channel layer to form a JFET.

6. The FET of claim 1 further comprising a material layer intermediate the gate contact and the active channel layer to form a MOSFET.

\* \* \* \* \*